(12) United States Patent
Herner

(10) Patent No.: US 7,176,064 B2
(45) Date of Patent: Feb. 13, 2007

(54) MEMORY CELL COMPRISING A SEMICONDUCTOR JUNCTION DIODE CRYSTALLIZED ADJACENT TO A SILICIDE

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 104 days.

(21) Appl. No.: 10/954,510

(22) Filed: Sep. 29, 2004

(65) Prior Publication Data

US 2005/0121743 A1 Jun. 9, 2005

Related U.S. Application Data

(63) Continuation-in-part of application No. 10/728,230, filed on Dec. 3, 2002, now Pat. No. 6,946,719.

(51) Int. Cl.
*H01L 21/82* (2006.01)
(52) U.S. Cl. ............... 438/131; 438/467; 438/600; 438/957; 257/530
(58) Field of Classification Search ............... 438/131, 438/467, 600, 957; 257/530, E23.147, E27.073
See application file for complete search history.

(56) References Cited

U.S. PATENT DOCUMENTS

| | | | | |
|---|---|---|---|---|
| 6,486,065 | B2 * | 11/2002 | Vyvoda et al. | 438/690 |
| 6,777,773 | B2 * | 8/2004 | Knall | 257/530 |
| 2004/0232509 | A1 * | 11/2004 | Vyvoda | 257/473 |

OTHER PUBLICATIONS

Hatalis, Miltiadis.K. ,et al. ,"Large grain polycrystalline silicon by low-temperature annealing of low-pressure chemical vapor deposited amorphous silicon films", *J. Appl. Phys. 63* (7), (Apr. 1, 1988),2260-2266.

Holloway, Karen.,et al. ,"Amorphous Ti-Si alloy formed by interdiffusion of amorphous Si and crystalline Ti multilayers", *J. Appl. Phys. 61* (4), (Feb. 15, 1987),1359-1364.

Kim, Tae-Kyun.,et al. ,"Oxidation behavior of a patterned TiSi2/polysilicon stack", *J. Vac. Sci. Technol. B 19*(2), (Mar./Apr. 2001),366-371.

Tang, Qiang.,et al. ,"Twinning in TiSi2-island catalyzed Si nanowires grown by gas-source molecular-beam epitaxy", *Applied Physics Letters*, vol. 81, No. 13, (Sep. 23, 2002),2451-2453.

Tung, R..T. ,"Oxide mediated epitaxy of CoSi2 on silicon", *Appl. Phys. Lett. 68* (24), (Jun. 10, 1996),3461-3463.

* cited by examiner

*Primary Examiner*—Andy Huynh
(74) *Attorney, Agent, or Firm*—Vierra Magen Marcus & DeNiro LLP

(57) ABSTRACT

A memory cell is formed of a semiconductor junction diode in series with an antifuse. The cell is programmed by rupture of the antifuse. The semiconductor junction diode comprises silicon, the silicon crystallized in contact with a silicide. The suicide apparently provides a template for crystallization, improving crystallinity and conductivity of the diode, and reducing the programming voltage required to program the cell. It is advantageous to reduce a dielectric layer (such as an oxide, nitride, or oxynitride) intervening between the silicon and the silicon-forming metal during the step of forming the silicide.

6 Claims, 5 Drawing Sheets

MEMORY CELL COMPRISING A SEMICONDUCTOR JUNCTION DIODE CRYSTALLIZED ADJACENT TO A SILICIDE

RELATED APPLICATIONS

This application is a continuation-in-part of Petti et al., U.S. patent application Ser. No. 10/728,230, "Semiconductor Device Including Junction Diode Contacting Contact-Antifuse Unit Comprising Silicide," filed Dec. 3, 2002 now U.S. Pat. No. 6,946,719, hereinafter the '230 application, assigned to the assignee of the present invention and hereby incorporated by reference.

This application is related to Herner et al., U.S. application Ser. No. 10/954,577, "Junction Diode Comprising Varying Semiconductor Compositions," hereinafter the '577 application; to Herner et al., U.S. application Ser. No. 10/955,549, "Nonvolatile Memory Cell Without a Dielectric Antifuse Having High- and Low-Impedance States," hereinafter the '549 application; and to Petti et al., U.S. application Ser. No. 10/955,387, "Fuse Memory Cell Comprising a Diode, the Diode Serving as the Fuse Element," all assigned to the assignee of the present invention, all filed on even date herewith and all hereby incorporated by reference in their entirety.

BACKGROUND OF THE INVENTION

The invention relates to a memory cell comprising a low-impedance semiconductor junction diode formed in proximity to a silicide and an antifuse.

Herner et al., U.S. patent application Ser. No. 10/326,470, "An Improved Method for Making High Density Nonvolatile Memory," filed Dec. 19, 2002 and hereinafter the '470 application, which is hereby incorporated by reference, employs a vertically oriented semiconductor junction diode interposed between conductors, the diode separated from at least one of the conductors by a dielectric rupture antifuse, or having a dielectric rupture antifuse interposed between diode portions.

In some circumstances, the programming voltage required to program this memory cell may be greater than desired. There is a need, therefore, to form a diode-antifuse memory cell having a reduced programming voltage.

SUMMARY OF THE PREFERRED EMBODIMENTS

The present invention is defined by the following claims, and nothing in this section should be taken as a limitation on those claims. In general, the invention is directed to a memory cell comprising a low-resistance semiconductor junction diode crystallized in contact with a silicide, the semiconductor junction diode in series with an antifuse.

A first aspect of the invention provides for a method for forming a memory cell, the method comprising: forming first semiconductor diode portions; forming a first layer of a silicide-forming metal; forming a first oxide, nitride, or oxynitride layer disposed between the first silicide-forming metal layer and one of the first semiconductor diode portions and in contact with both; and annealing the first semiconductor diode portions, first silicide-forming metal layer, and first oxide, nitride, or oxynitride layer to substantially entirely reduce the first oxide, nitride, or oxynitride layer between the silicide and the first semiconductor diode portions and to form a first silicide layer by siliciding a fraction of one or more of the first diode portions.

Another aspect of the invention provides for a method for forming a first plurality of memory cells, the method comprising: forming a plurality of substantially parallel first conductors extending in a first direction at a first height above a substrate; forming a plurality of first semiconductor pillars at a second height above the substrate, wherein the second height is different from the first height; forming a plurality of first silicide layers in contact with each first semiconductor pillar; forming a plurality of first dielectric rupture antifuses disposed between the first silicide layers and the first conductors and in contact with both.

A preferred embodiment of the invention provides for a method for forming a first memory level of memory cells in a memory array, the method comprising: forming a plurality of first conductors at a first height above a substrate in a first pattern and etch step; forming a plurality of semiconductor pillars above the first conductors in a second pattern and etch step; crystallizing the plurality of first semiconductor pillars, wherein each of the first semiconductor pillars is in contact with a silicide at the time it is crystallized; forming a plurality of second conductors above the first semiconductor pillars in a third pattern and etch step; and forming a plurality of dielectric rupture antifuses between the first and second conductors, each antifuse in series with a first semiconductor pillar of the plurality of first semiconductor pillars, and each antifuse in contact with one of the conductors, wherein the first, second, and third pattern and etch steps are all separate.

An aspect of the invention provides for a method for forming a monolithic three dimensional memory array, the method comprising: forming a plurality of substantially parallel first conductors extending in a first direction at a first height above a substrate, the first conductors not comprising silicide; forming a plurality of substantially parallel second conductors extending in a second direction at a second height above the substrate, the second conductors not comprising silicide, wherein the second height is different from the first height; forming a plurality of first junction diodes disposed between the first conductors and the second conductors, wherein each of the junction diodes contacts one of a plurality of silicide layers, wherein the first conductors, first junction diodes, and second conductors make up a first memory level; and monolithically forming a second memory level above the first memory level.

Another aspect of the invention provides for a memory level of nonvolatile programmable memory cells comprising: a plurality of substantially parallel first conductors formed at a first height above a substrate; a plurality of first pillars formed at a second height above the first height, each pillar comprising a silicide layer; a plurality of substantially parallel second conductors formed at a third height above the second height; and a plurality of dielectric rupture antifuses, each between one of the plurality of first pillars and one of the plurality of first or second conductors.

A preferred embodiment of the invention provides for a monolithic three dimensional memory array comprising: a first memory level, the first memory level comprising: a plurality of substantially parallel, substantially coplanar bottom conductors; a plurality of substantially parallel, substantially coplanar top conductors above the bottom conductors; a plurality of pillars, each pillar disposed between one of the bottom conductors and one of the top conductors, and each pillar comprising a silicide layer; and a plurality of dielectric regions, each between one of the pillars and one of the conductors; and a second memory level monolithically formed above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

A semiconductor junction diode, for example a p-n diode or a p-i-n diode, has been paired with a dielectric rupture antifuse to form a memory cell, for example in the monolithic three dimensional memory array described in the '470 application.

The term junction diode is used herein to refer to a semiconductor device with the property of conducting current more easily in one direction than the other, having two terminal electrodes, and made of semiconducting material which is p-type at one electrode and n-type at the other. Examples include p-n diodes and n-p diodes, which have p-type semiconductor material and n-type semiconductor material in contact, and p-i-n and n-i-p diodes, in which intrinsic (undoped) semiconductor material is interposed between p-type semiconductor material and n-type semiconductor material.

Figure 1:
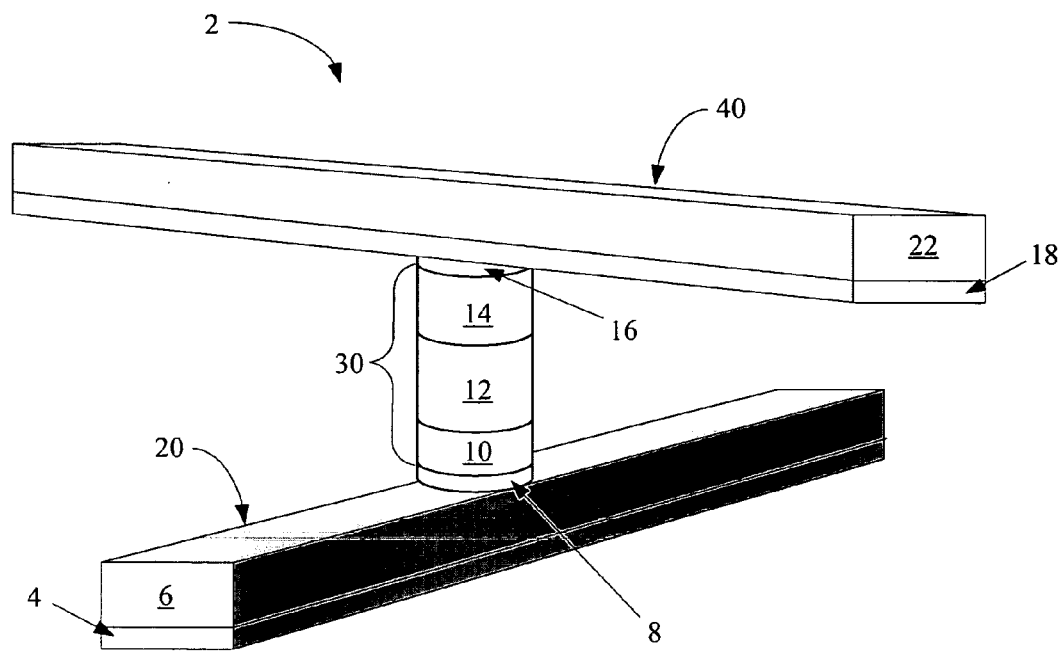
FIG. 1 is a perspective view of a memory cell comprising a vertically oriented junction diode and a dielectric rupture antifuse disposed between top and bottom conductors.

A preferred memory cell of the '470 application includes a vertically oriented junction diode disposed between conductors, the cell further having a dielectric rupture antifuse interposed between the junction diode and one of the conductors. A memory cell 2 according to the '470 application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material of a second conductivity type, and heavily doped semiconductor layer 14 of the second conductivity type. A thin silicon dioxide antifuse layer 16 is formed on top of the junction diode 30. Second conductor 40 preferably comprises titanium nitride layer 18 and tungsten layer 22. Silicon dioxide layer 16 operates as a dielectric rupture antifuse.

The memory cell 2 is unprogrammed as formed. As formed, the cell is in an initial high-impedance state with little or no current flow, and after application of a programming voltage, the cell is in a low-impedance state with significantly increased current flow. To program the memory cell, a programming voltage is applied between conductors 20 and 40.

As taught in the application Ser. No. 10/955,549, the memory cell of embodiments of the '470 application has been modified by omitting the dielectric rupture antifuse (silicon dioxide layer 16 in FIG. 1.) It has been found that the resulting memory cell exhibits similar behavior: As formed, the cell is in an initial high-impedance state with little or no current flow, and after application of a programming voltage, the cell is in a low-impedance state with significantly increased current flow. Such a memory cell 3, having no dielectric rupture antifuse, is shown in FIG. 2.

While not wishing to be bound by any particular theory, it may be that application of a programming voltage to the memory cell of the application Ser. No. 10/955,549, changes the characteristics of junction diode 30, which is typically formed of polycrystalline silicon (polysilicon), changing the resistance of junction diode 30. One possibility is that the polysilicon of junction diode 30 is formed in a high-resistance state, and a low-resistance filament is formed through the pillar upon application of a programming voltage.

It has been found that a programming voltage of six to eight volts is required to convert the junction diode 30 of memory cell 3 from a high-impedance to a low-impedance state. For many applications, it is desirable to reduce the voltage required to program a cell.

Figure 2:
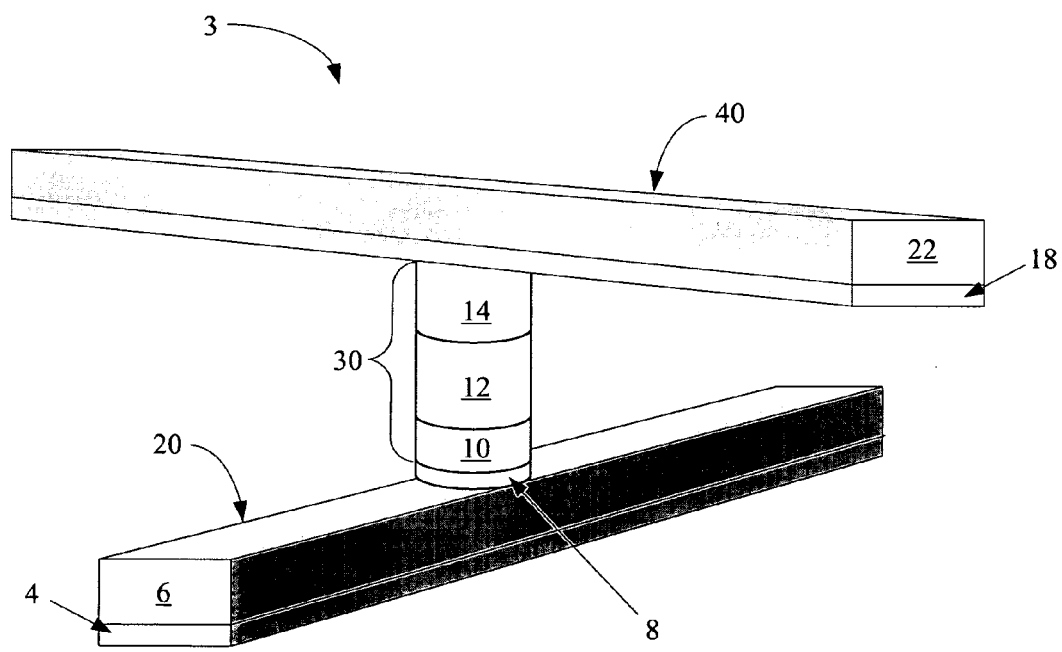
FIG. 2 is a perspective view of a memory cell comprising a vertically oriented junction diode having no dielectric rupture antifuse disposed between top and bottom conductors.

In embodiments of the present invention, in a memory cell similar to the ones shown in FIGS. 1 and 2, the semiconductor junction diode 30 is formed in a low-impedance state. This low-impedance state is apparently induced if amorphous silicon junction diode 30 is crystallized while in contact with a metal silicide. The metal silicide may provide a template for crystal growth of the silicon, decreasing the density of silicon defects. It is particularly advantageous to form the silicide by 1) depositing silicon, 2) forming an oxide, nitride, or oxynitride on the silicon, 3) forming a silicide-forming metal on the oxide, nitride, or oxynitride, then 4) annealing to reduce the oxide, nitride, or oxynitride and, in the same anneal step, form the silicide by reaction of the silicide-forming metal with the silicon. A dielectric rupture antifuse is then formed in series with the low-impedance junction diode, forming a memory cell.

In general, then, such a cell can be formed by forming first semiconductor diode portions; forming a first layer of a silicide-forming metal; forming a first oxide, nitride, or oxynitride layer disposed between the first silicide-forming metal layer and one of the first semiconductor diode portions and in contact with both; and annealing the first semiconductor diode portions, first silicide-forming metal layer, and first oxide, nitride, or oxynitride layer to substantially entirely reduce the first oxide, nitride, or oxynitride layer between the silicide and the first semiconductor diode portions and to form a first silicide layer by siliciding a fraction of one or more of the first diode portions.

Figure 3:
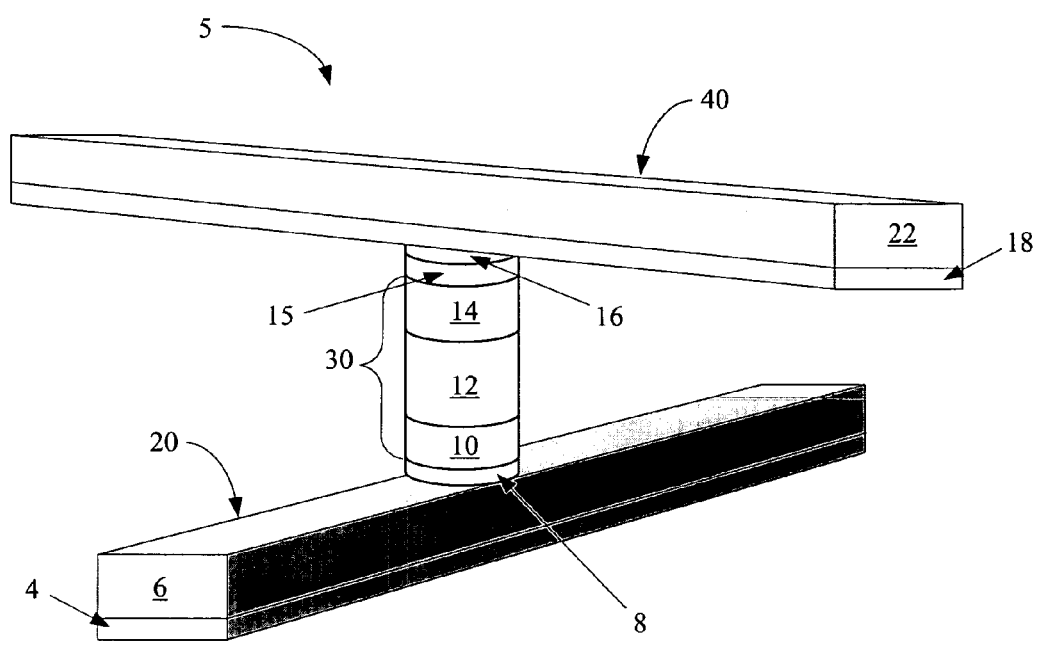
FIG. 3 is a perspective view of a memory cell formed according to the present invention comprising a vertically oriented junction diode adjacent to a silicide layer and in series with an antifuse.

A memory cell 5 formed according to the present invention is shown in FIG. 3. Most of the layers are the same as in the cell of FIG. 1, including first conductor 20 of titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material of a second conductivity type, and heavily doped semiconductor layer 14 of the second conductivity type. A silicide layer 15 is formed at the top of the junction diode 30, and a dielectric antifuse layer 16 is formed on top of silicide layer 15. Second conductor 40 preferably comprises titanium nitride layer 18 and tungsten layer 22.

To compare the memory cells of FIG. 1 and FIG. 3, each shown before programming: Each includes a dielectric rupture antifuse 16 and a junction diode 30. The junction diode 30 of FIG. 1, however, is formed in a high-impedance state, while the junction diode 30 of FIG. 3 is formed in a low-impedance state. Both memory cells are programmed by applying a programming voltage across the cell. In both cells, in order to program the cell, the dielectric rupture antifuse 16 must be ruptured. To program the cell of FIG. 1 it is also necessary to convert junction diode 30 from a high-impedance to a low-impedance state; the cell of FIG. 3 is already in a low-impedance state.

A detailed example will be provided of fabrication of an array of memory cells formed according to aspects of the present invention. For completeness, many details of materials, process conditions, and steps will be provided. It will be understood, however, that many details can be changed, omitted or supplemented while the results fall within the scope of the invention.

Fabrication

The '470 application described fabrication of a monolithic three dimensional memory array comprising memory cells like those of FIG. 1. The '230 application described fabrication of a monolithic three dimensional memory array comprising a related memory cell. The methods and procedures taught in those applications, with modifications described in this discussion, can provide guidance in formation of monolithic three dimensional memory arrays comprising diode-antifuse memory cells. For clarity, not all of the details of the '470 and '230 applications will be included, but it will be understood that no teaching of these applications is intended to be excluded.

Fabrication of a single memory level is described in detail. Additional memory levels can be stacked, each monolithically formed above the one below it.

Figure 4A:
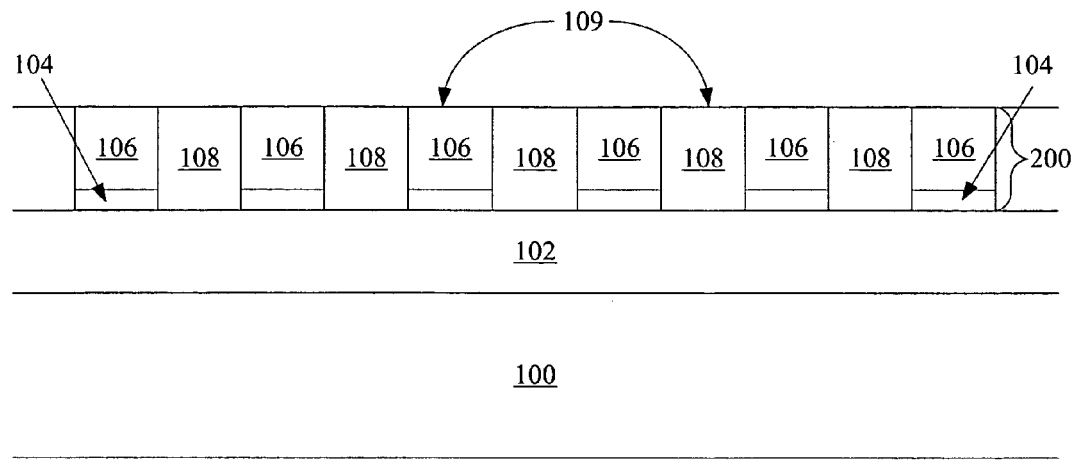
FIGS. 4a–4d are cross-sectional views illustrating fabrication of a plurality of memory cells formed according to the present invention.

Turning to FIG. 4a, formation of the memory begins with a substrate 100. This substrate 100 can be any semiconducting substrate as known in the art, such as monocrystalline silicon, IV—IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer is tungsten, titanium nitride is preferred as an adhesion layer.

If adhesion layer 104 is included, it can be deposited by any process known in the art. Where adhesion layer 104 is titanium nitride, it can be formed by depositing a titanium nitride material, or by depositing titanium, which is then subject to a nitridation process. The titanium nitride can be deposited by any chemical vapor deposition (CVD) process, physical vapor deposition (PVD) process such as sputtering, or an atomic layer deposition (ALD) process. In one embodiment, the titanium nitride material is deposited by a sputtering process.

The thickness of adhesion layer 104 can range from about 20 to about 500 angstroms. In one embodiment, the thickness of adhesion layer 104 is about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, including tantalum, titanium, tungsten, copper, cobalt, or alloys thereof. Titanium nitride may be used. Where conducting layer 106 is tungsten, it can be deposited by any CVD process or a PVD process. In one embodiment, the tungsten is deposited by a CVD process. The thickness of conducting layer 106 can depend, in part, on the desired sheet resistance and therefore can be any thickness that provides the desired sheet resistance. In one embodiment, the thickness of conducting layer 106 can range from about 200 to about 2000 angstroms. In another embodiment, the thickness of conducting layer 106 is about 1500 angstroms.

If tungsten is used for conducting layer 106, it is preferred to use a barrier layer between the tungsten and the semiconductor material that will be part of the semiconductor pillars that will eventually overlie the conductors. Such a barrier layer serves to prevent reaction between tungsten and silicon. The barrier layer may either be patterned with the conductor rails or with the semiconductor pillars.

If a barrier layer is to be used, and is to be formed as the top layer of the conductor rails, the barrier layer should be deposited after the conducting layer 106. (The barrier layer is not shown in FIG. 4a.) Any material serving this function can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Once all the layers that will form the conductor rails have been deposited, the layers will be patterned and etched using any suitable masking and etching process to form substantially parallel, substantially coplanar conductors 200, shown in FIG. 4a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a liquid solvent such as EKC.

The width of conductor rails 200 after etch can range from about 300 to about 2500 angstroms. (In this discussion "width" will refer to the width of a line or feature measured in the plane substantially parallel to substrate 100.) The width of the gaps between conductor rails 200 preferably is substantially the same as the width of conductor rails 200 themselves, though it may be greater or less. In one embodiment, the width of conductor rails is about 1500 angstroms, as is the width of the intervening gaps.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as CVD, or, for example, high density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as chemical mechanical planarization (CMP) or etchback. For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used.

Alternatively, conductor rails can be formed by a Damascene process, in which oxide is deposited, lines are etched in the oxide, then the lines are filled with titanium nitride and tungsten to create the conductor rails. The titanium nitride and tungsten films on top of the original plane of oxide are removed by any process known in the art, such as CMP or etchback, leaving titanium nitride and tungsten wires, with dielectric material insulating the wires from one another.

At this stage, a plurality of substantially parallel first conductors have been formed at a first height above substrate 100.

Figure 4B:
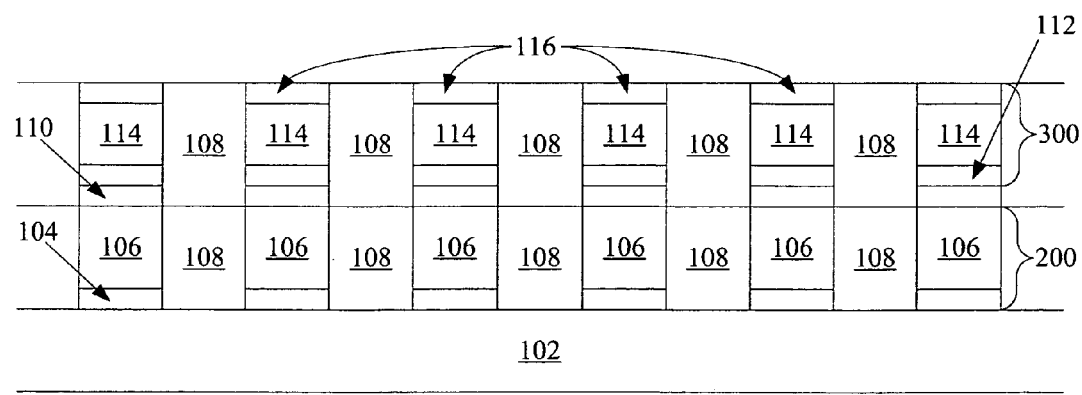

Next, turning to FIG. 4b, vertical semiconductor pillars will be formed above completed conductor rails 200. (To save space substrate 100 is omitted in FIG. 4b; its presence will be assumed.) If a barrier layer 110 is to be used between the lower conductor rails and the semiconductor elements, and has not yet been formed, it will be deposited as the first layer after planarization of the conductor rails. It can be of any of the materials and deposited in any of the manners described earlier. Its thickness can be, for example, about 20 to about 500 angstroms. The thickness of barrier layer 110 is preferably about 200 angstroms.

Next semiconductor material that will be patterned into pillars is deposited. The semiconductor material can be silicon, silicon-germanium, silicon-germanium-carbon, germanium, or other suitable IV—IV compounds, gallium arsenide, indium phosphide, or other suitable III-V compounds, zinc selinide, or other II-VII compounds, or a combination. Silicon is commonly used in the industry, so, for simplicity, this description will refer to the semiconductor material as silicon, but it will be understood that other materials may be substituted.

Figure 5A:
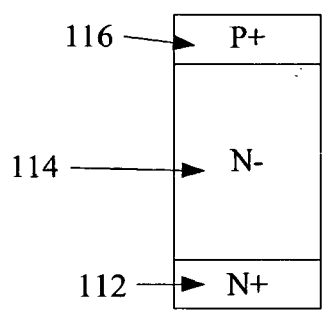
FIGS. 5a–5d are cross-sectional views showing preferred junction diodes for use in a memory cell.
Figure 5B:
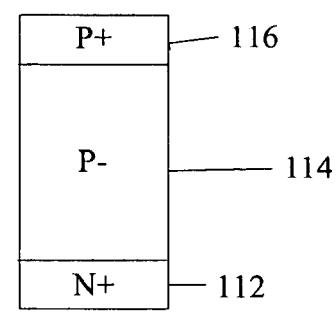
Figure 5C:
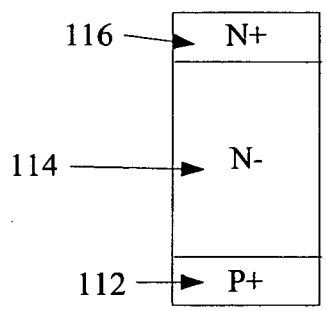
Figure 5D:
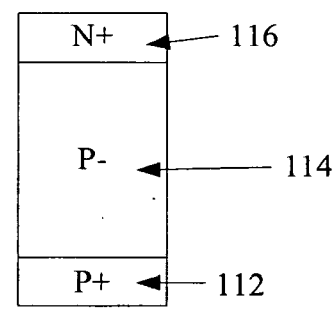

In preferred embodiments, the semiconductor pillar is a junction diode, comprising a bottom heavily doped region of a first conductivity type and a top heavily doped region of a second conductivity type. The middle region, between the top and bottom regions, is an intrinsic or lightly doped region of either the first or second conductivity type. FIGS. 5a–5d illustrate preferred permutations: In the diodes of FIGS. 5a and 5b, bottom region 112 is N+ (heavily doped n-type silicon), and top region 116 is P+. In the diodes of FIGS. 5c and 5d, bottom region 112 is P+ and top region 116 is N+. In FIGS. 5a and 5c, middle region 114 is N−, while in FIGS. 5b and 5d, middle region 114 is P−. The middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode.

To form, for example, the diode of FIG. 5a, a layer of heavily doped n-type silicon 112 must be formed. This layer can be formed by any deposition and doping method known in the art. The silicon can be deposited and then doped, but is preferably doped in situ by flowing a donor gas providing dopant atoms during deposition of the silicon. In a preferred embodiment, this layer can range from about 100 to about 1000 angstroms, preferably 200 angstroms, and have a dopant concentration of about $1 \times 10^{19}$ to about $2 \times 10^{21}$ atoms/cm$^3$, and preferably about $8 \times 10^{20}$ atoms/cm$^3$.

The next layer 114 will be intrinsic silicon. This layer can formed by any deposition method known in the art. The thickness of the lightly doped n-type silicon layer can range from about 1000 to about 4000 angstroms, preferably about 2500 angstroms, and have a dopant concentration of about $1 \times 10^{15}$ to about $1 \times 10^{18}$ atoms/cm$^3$, and preferably $1 \times 10^{15}$ atoms/cm$^3$. In one embodiment, silicon is deposited without intentional doping, yet has defects which render it slightly n-type.

Above this is a layer 116 of heavily doped p-type silicon. This layer is preferably deposited undoped, then doped by ion implantation. Preferably layers 114 and 116 are deposited in a single deposition step. The thickness of heavily doped p-type silicon layer 116 can range from about 100 to about 2000 angstroms, preferably about 800 angstroms. Note this is the thickness in the completed device. Some portion of the top of this layer will be consumed in a subsequent CMP or etchback step; thus it is preferable to deposit more silicon than is actually desired in the finished device, assuming some will be lost. Preferably about 800 angstroms of silicon is deposited above the desired thickness, and about this much is removed in CMP or etchback. This layer has a dopant concentration of about $2 \times 10^{19}$ to about $4 \times 10^{21}$ atoms/cm$^3$, preferably about $8 \times 10^{20}$ atoms/cm$^3$.

Returning to FIG. 4b, semiconductor layers 116, 114 and 112 just deposited will be patterned and etched to form semiconductor pillars 300. If barrier layer 110 was not patterned with the bottom conductor rails, it will be patterned with the pillars. Semiconductor pillars 300 should have about the same pitch and about the same width as conductors 200 below, such that each semiconductor pillar 300 is formed on top of a conductor 200. Some misalignment can be tolerated.

The semiconductor pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The pitch and width of the pillars can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD, or, for example, HDPCVD.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. For example, the etchback techniques described in Raghuram et al. can be used. The resulting structure is shown in FIG. 4b. The ion implantation of heavily doped top regions 116 should be performed at this point, in this example using p-type dopants to form a P+ region.

Figure 4C:
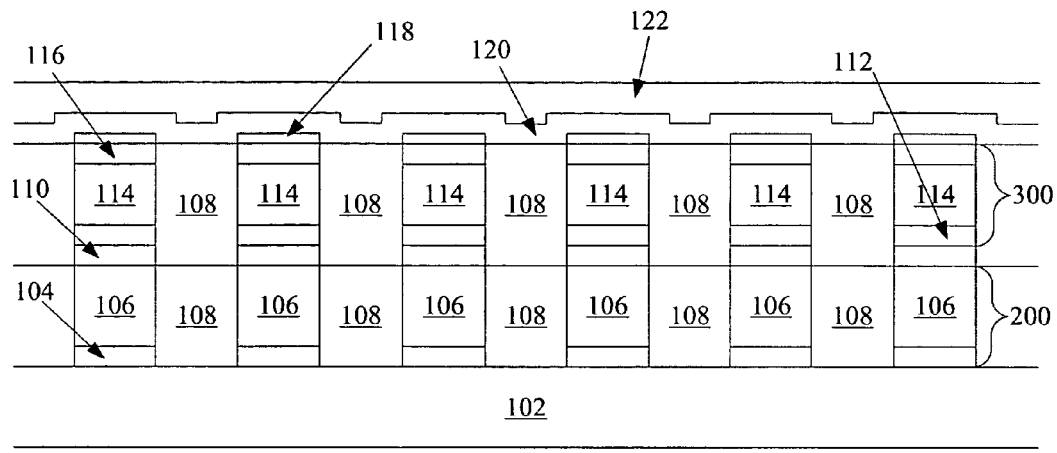

Turning to FIG. 4c, next an oxide, nitride, or oxynitride layer 118 is formed on heavily doped regions 116. In preferred embodiments, as shown, a silicon dioxide layer 118 is grown by oxidizing silicon at the tops of heavily doped regions 116 at about 600 to about 850 degrees C. for about 20 seconds to about two minutes, forming between about 15 and about 50 angstroms of silicon dioxide. Preferably, oxide layer 118 is formed by exposing the wafer to about 800 degrees for about one minute in an oxygen-containing ambient. Layer 118 could be deposited instead.

Next a layer 120 of a silicide-forming metal is deposited. Preferred silicide-forming metals to be used for this purpose include titanium, cobalt, chromium, tantalum, platinum, nickel, niobium, and palladium. This example will describe the use of titanium for layer 120, but it will be understood that any of the other materials can be used.

Titanium layer 120 is deposited to any suitable thickness, for example between about 60 and about 200 angstroms, preferably between about 100 and about 150 angstroms, most preferably about 100 angstroms. To prevent oxidation of titanium layer 120, titanium nitride layer 122 is deposited, preferably about 300 angstroms thick. Layers 120 and 122 can be deposited by any conventional method, for example by sputtering.

An anneal is performed between about 600 and about 800 degrees from about 10 seconds to about two minutes, preferably between about 650 degrees and about 750 degrees, most preferably at about 670 degrees for about 20 seconds, for example in nitrogen. The anneal serves to reduce oxide layer 118 and to react titanium layer 120 with heavily doped regions 116 where it overlies them to form titanium silicide. Oxide layer 118 is substantially entirely reduced between titanium layer 120 and the silicon of heavily doped region 116. If oxide layer 118 was deposited rather than grown, the rest of oxide layer 118 (between the tops of semiconductor pillars 300, overlying dielectric fill 108) would remain.

Figure 4D:
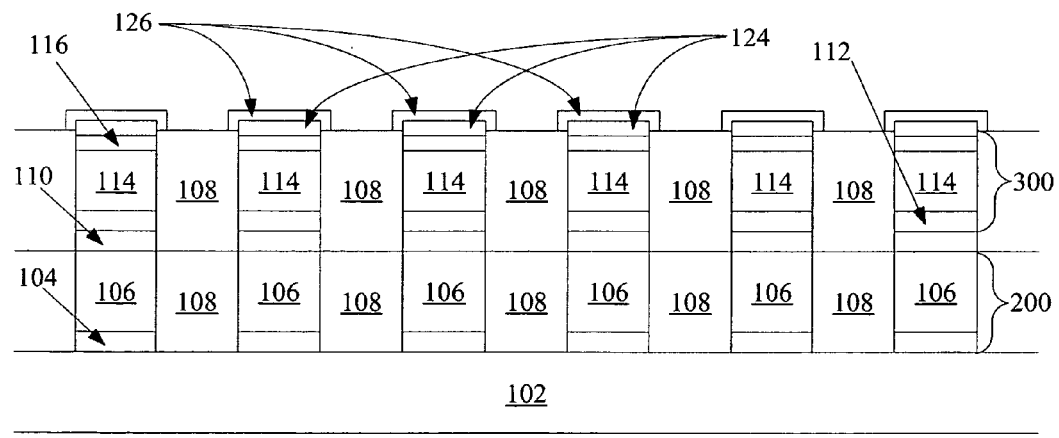

As in a conventional salicide process, titanium nitride layer 122 and unreacted titanium are stripped in a selective wet etch, leaving behind titanium silicide layers 124, each formed in a disk-shaped region on the top of one of the junction diodes 30, shown in FIG. 4d.

Conventional salicide formation includes a second anneal following strip of the unreacted titanium to convert the titanium silicide from the high-resistivity C49 phase to the low-resistivity C54 phase. In embodiments of the present invention this step is omitted. It is known that this conversion is difficult to achieve when the volume of titanium suicide is very small, as in titanium silicide layers 124. This conversion may not be necessary for the present use, and the anneal used to form a dielectric rupture antifuse in a following step may accomplish whatever phase conversion is achievable.

As noted, in this example it is assumed that titanium is used in the silicide-forming metal layer 120, but other materials, including cobalt, chromium, tantalum, platinum, nickel, niobium, and palladium, could have been used instead. Thus titanium silicide layer 124 could instead be some other silicide, such as cobalt silicide, chromium silicide, tantalum silicide, platinum silicide, nickel silicide, niobium silicide, or palladium silicide.

At this point a plurality of first pillars has been formed above the first conductors, each pillar comprising a silicide layer.

Dielectric rupture antifuse 126 is formed on titanium silicide layer 124, preferably by oxidation of titanium silicide layer 124. Oxidation is performed between about 600 and about 850 degrees for between about 20 seconds to about two minutes, preferably at about 775 degrees for about two minutes. If dielectric rupture antifuse 126 is grown by oxidation, it is probably a mix of silicon dioxide and titanium dioxide. As those skilled in the art will appreciate, leakage current across dielectric rupture antifuse 126 will decrease as the width of junction diode 30 decreases; the thickness of the antifuse, and thus the conditions used to produce it, will be varied accordingly. Alternatively, dielectric rupture antifuse 126 can be formed by other methods, for example by deposition.

Overlying conductors can be formed in the same manner as the underlying conductors. The overlying conductors will be formed at a height above the height of the first conductors, and extend in a different direction from them, preferably substantially perpendicular to them. Each memory cell comprises a portion of one of the first conductors, one of the first pillars, one of the dielectric rupture antifuses, and a portion of one of the second conductors. The resulting structure is a bottom or first level of memory cells. Additional memory levels can be monolithically formed above the first, as described in the '470 and '230 applications and the other incorporated references, forming a monolithic three dimensional memory array. For example, a second plurality of pillars can be formed above the upper conductors, and a third plurality of conductors can be formed above them. The upper conductors of one memory level can serve as the lower conductors of an overlying memory level, or an interlevel dielectric can be formed between them.

It will be noted that the first conductors were formed in a first pattern and etch step, the pillars were formed in a second pattern and etch step, and the second conductors were formed in a third pattern and etch step. The three pattern and etch steps are separate. Prior art three dimensional memories, such as Johnson et al., U.S. Pat. No. 6,034,882, "Vertically stacked field programmable nonvolatile memory and method of fabrication," form analogous structures in pattern and etch steps that overlap.

Junction diode 30 in FIG. 3, formed according to the present invention, is in a low impedance state as formed. This is in contrast to the junction diodes of FIGS. 1 and 2, which are formed in a high-impedance state. As noted earlier, it is believed that contact with a silicide, such as titanium suicide layer 124 of FIG. 4b (layer 16 of FIG. 3), may provide a template for crystal growth of the silicon, decreasing its defect density and increasing its conductivity.

The example just provided included formation of oxide layer 118 which was reduced during formation of titanium silicide layer 124. Forming and reducing this layer is preferred, but the step of reducing an oxide during silicide formation is not necessary in all embodiments to form a low-impedance junction diode.

Various diode configurations were shown in FIGS. 5a–5d. In FIGS. 5c and 5d, bottom region 112 is in situ doped with a p-type dopant such as boron. Boron atoms tend to promote crystallization of silicon during deposition, and in most conventional silicon deposition methods, silicon heavily in situ doped with boron will be polycrystalline as deposited. If the diode of FIG. 5c, for example, is used in the memory cells shown being fabricated in FIGS. 4a through 4d, it may be that some portion of the junction diode 300 will be crystalline before silicide layer 124 is formed. In this case, silicide layer 124 may not successfully provide a template to improve the crystallinity of the portions of the junction diode that are already crystallized. In preferred embodiments, the junction diode is amorphous silicon as deposited (as in the detailed example provided), and is crystallized in contact with a silicide. Note that if bottom region 112 is formed heavily doped with a p-type dopant in a way that allows it to be amorphous (doped by ion implantation, for example), it is expected that a low-impedance diode could be successfully created.

The silicide layer is advantageous for reducing the impedance of the junction diode, but may not be desired in the finished device. In an alternative embodiment, following formation of the silicide layer on the junction diode, the silicide layer can be removed. This allows the dielectric rupture antifuse to be grown on silicon (at the top of the junction diode) rather than on a silicide. This may be advantageous if a higher quality antifuse is required.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Herner, U.S. application Ser. No. 10/095, 962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Vyvoda, U.S. patent application Ser. No. 10/440, 882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,451, filed Dec. 5, 2003, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array. Each memory level is monolithically formed on the memory level below it.

The memory cell of the present invention has been described as formed in a monolithic three dimensional memory array having stacked memory levels, but such cells could clearly be formed in a two-dimensional array, as well. The example given showed the silicide layer formed above the junction diode, but those skilled in the art will appreciate that the silicide layer can be formed elsewhere: beside the junction diode or below it, for example. Many configurations can be imagined.

In embodiments described herein, such as in the detailed example, a silicide layer is formed in a semiconductor pillar. The conductors do not comprise silicide. Embodiments can be envisioned, however, in which one or both conductors do comprise silicide.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a first memory level of memory cells in a memory array, the method comprising:

forming a plurality of first conductors at a first height above a substrate in a first pattern and etch step;

forming a plurality of semiconductor pillars above the first conductors in a second pattern and etch step;

crystallizing the plurality of first semiconductor pillars, wherein each of the first semiconductor pillars is in contact with a silicide at the time it is crystallized;

forming a plurality of second conductors above the first semiconductor pillars in a third pattern and etch step; and forming a plurality of dielectric rupture antifuses between the first and second conductors, each antifuse in series with a first semiconductor pillar of the plurality of first semiconductor pillars, and each antifuse in contact with one of the conductors, wherein the first, second, and third pattern and etch steps are all separate.

2. The method of claim 1 further comprising removing the silicide before formation of the plurality of second conductors.

3. The method of claim 1 wherein the silicide is selected from a group consisting of titanium silicide, cobalt silicide, chromium silicide, tantalum silicide, platinum silicide, nickel silicide, niobium silicide, and palladium silicide.

4. The method of claim 1 further comprising forming the silicide, wherein the step of forming the silicide comprises:

forming an oxide, nitride, or oxynitride adjacent to a silicon layer;

depositing a silicide-forming metal in contact wit the oxide, nitride, or oxynitride, wherein the oxide, nitride, or oxynitride is disposed between the silicon layer and the silicide-forming metal; and annealing to form the silicide and substantially entirely reduce the oxide, nitride, or oxynitride where the oxide, nitride, or oxynitride is adjacent to the silicon layer.

5. The method of claim 4 wherein the silicon layer is a portion of a semiconductor pillar of the first plurality of semiconductor pillars.

6. The method of claim 1 wherein the first memory level is one of a plurality of stacked memory levels formed in a monolithic three dimensional memory array.

* * * * *